US010964741B1

(12) United States Patent
Chen et al.

(10) Patent No.: US 10,964,741 B1
(45) Date of Patent: Mar. 30, 2021

(54) BACKSIDE ILLUMINATED SENSOR PIXEL STRUCTURE

(71) Applicant: OMNIVISION TECHNOLOGIES, INC., Santa Clara, CA (US)

(72) Inventors: Gang Chen, San Jose, CA (US); Qin Wang, San Jose, CA (US)

(73) Assignee: OmniVision Technologies, Inc., Santa Clara, CA (US)

(*) Notice: Subject to any disclaimer, the term of this patent is extended or adjusted under 35 U.S.C. 154(b) by 0 days.

(21) Appl. No.: 16/575,269

(22) Filed: Sep. 18, 2019

(51) Int. Cl.
*H01L 27/146* (2006.01)

(52) U.S. Cl.
CPC .... *H01L 27/1464* (2013.01); *H01L 27/14612* (2013.01); *H01L 27/14621* (2013.01); *H01L 27/14623* (2013.01); *H01L 27/14685* (2013.01); *H01L 27/14689* (2013.01)

(58) Field of Classification Search
None
See application file for complete search history.

(56) References Cited

U.S. PATENT DOCUMENTS

| | | | | |
|---|---|---|---|---|
| 9,679,932 B2* | 6/2017 | Kato | .................. | H01L 27/14623 |
| 9,812,483 B2* | 11/2017 | Chen | .................. | H01L 27/14623 |
| 2005/0088551 A1* | 4/2005 | Lee | ....................... | H04N 17/002 |
| | | | | 348/272 |
| 2012/0273854 A1* | 11/2012 | Velichko | .............. | H01L 27/1461 |
| | | | | 257/290 |
| 2015/0035028 A1* | 2/2015 | Fan | .................... | H01L 27/14638 |
| | | | | 257/292 |
| 2015/0256769 A1* | 9/2015 | Kim | .................. | H01L 27/14812 |
| | | | | 348/302 |
| 2016/0111461 A1* | 4/2016 | Ahn | ..................... | H01L 27/1464 |
| | | | | 250/208.1 |
| 2016/0126266 A1* | 5/2016 | Kato | ................. | H01L 27/14643 |
| | | | | 257/228 |
| 2018/0033809 A1* | 2/2018 | Tayanaka | .............. | H01L 27/146 |

\* cited by examiner

*Primary Examiner* — J. E. Schoenholtz
(74) *Attorney, Agent, or Firm* — Christensen O'Connor; Johnson Kindness PLLC (57) ABSTRACT

Backside illuminated sensor pixel structure. In one embodiment, an image sensor includes a plurality of photodiodes arranged in rows and columns of a pixel array that are disposed in a semiconductor substrate. Individual photodiodes of the pixel array are configured to receive incoming light through a backside of the semiconductor substrate. The individual photodiodes have a diffusion region formed in an epitaxial region and a plurality of storage nodes (SGs) that are disposed on the front side of the semiconductor substrate and formed in the epitaxial region. An opaque isolation layer having a plurality of opaque isolation elements is disposed proximate to the front side of the semiconductor substrate and proximate to the diffusion region of the plurality of photodiodes. The opaque isolation elements are configured to block a path of incoming light from the backside of the semiconductor substrate toward the storage nodes.

21 Claims, 6 Drawing Sheets

BACKSIDE ILLUMINATED SENSOR PIXEL STRUCTURE

BACKGROUND INFORMATION

Field of the Disclosure

This disclosure relates generally to the design of image sensors, and in particular, relates to the image sensors that reduce optical cross-talk.

Background

Image sensors have become ubiquitous. They are widely used in digital still cameras, cellular phones, security cameras, as well as medical, automotive, and other applications. The technology for manufacturing image sensors continues to advance at a great pace. For example, the demands for higher image sensor resolution and lower power consumption motivate further miniaturization and integration of image sensors into digital devices.

As the resolution of image sensors is increased, the spacing between the photodiodes is typically decreased, resulting in narrower and deeper photodiodes. These more closely packed photodiodes are more susceptible to optical noise caused by stray light. For example, after illuminating the target photodiode, the incoming light may be reflected toward neighboring photodiodes, therefore increasing the level of signal noise for those photodiodes. Stray light may also be generated by light reflections from the metallization layers.

In some applications, the photodiodes are illuminated from the backside of a semiconductor substrate of a semiconductor die. The noise generated by stray light may be even more significant for the backside illuminated photodiodes, because their semiconductor regions, being less shielded by the layers of electrical wiring at the front side of the image sensor, are more exposed to the stray light. As a result, the accuracy or the range of applicability of the image sensors may be limited.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Image sensors, and in particular, image sensors having reduced sensitivity to optical noise are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, examples in accordance with the teachings of the present technology are directed to photodiodes (also referred to as channels or pixels) having improved immunity to stray light, reduced inter-channel noise and/or reduced inter-channel cross-talk. The backside illuminated photodiodes may be subjected to stray light that is reflected from the metallization or stray light that arrives from the neighboring diodes, either as reflected or transmitted light. In some embodiments, an opaque isolation layer is disposed over the top side (or the side proximate to a front side of the semiconductor substrate) of the photodiodes to limit the amount of stray light impinging on the diffusion region of the photodiodes. In some embodiments, an individual opaque isolation element covers at least the extent of the N-type diffusion region of an individual photodiode. In operation, the opaque isolation elements either reflect or absorb at least part of the incoming stray light, thereby reducing optical noise at the semiconductor diffusion regions of the photodiodes.

In some embodiments, the opaque isolation layer may include a plurality of opaque isolation elements, and each opaque isolation element being disposed between the front side of the semiconductor substrate and the corresponding photodiode. Each of the opaque isolation elements may include a layer of metal (or metal alloy) that is coated in a dielectric layer. Metal layers are typically characterized by high absorption of light, while dielectric layers can prevent or reduce electrical leakage into the semiconductor diffusion regions. The opaque isolation layer may be manufactured as part of the manufacturing process of the sensor array. In some embodiments, the dielectric layer can also be opaque.

In some embodiments, individual photodiodes include light shields (e.g., metal light shields) having openings that are centered over the N-type diffusion region of the photodiodes. These openings pass the incoming light toward the N-type diffusion region, while limiting a non-desired illumination of the neighboring N-type diffusion regions.

In some embodiments, the semiconductor materials of the photodiode (e.g., N-type diffusion region) are electrically coupled to the associated transfer transistor for transferring accumulated charges to a floating diffusion by vertical electrodes made of metal. Since these vertical electrodes extend relatively deep into the semiconductor material, the vertical gates may further limit the stray light noise among the photodiodes of the image sensor.

Figure 1:
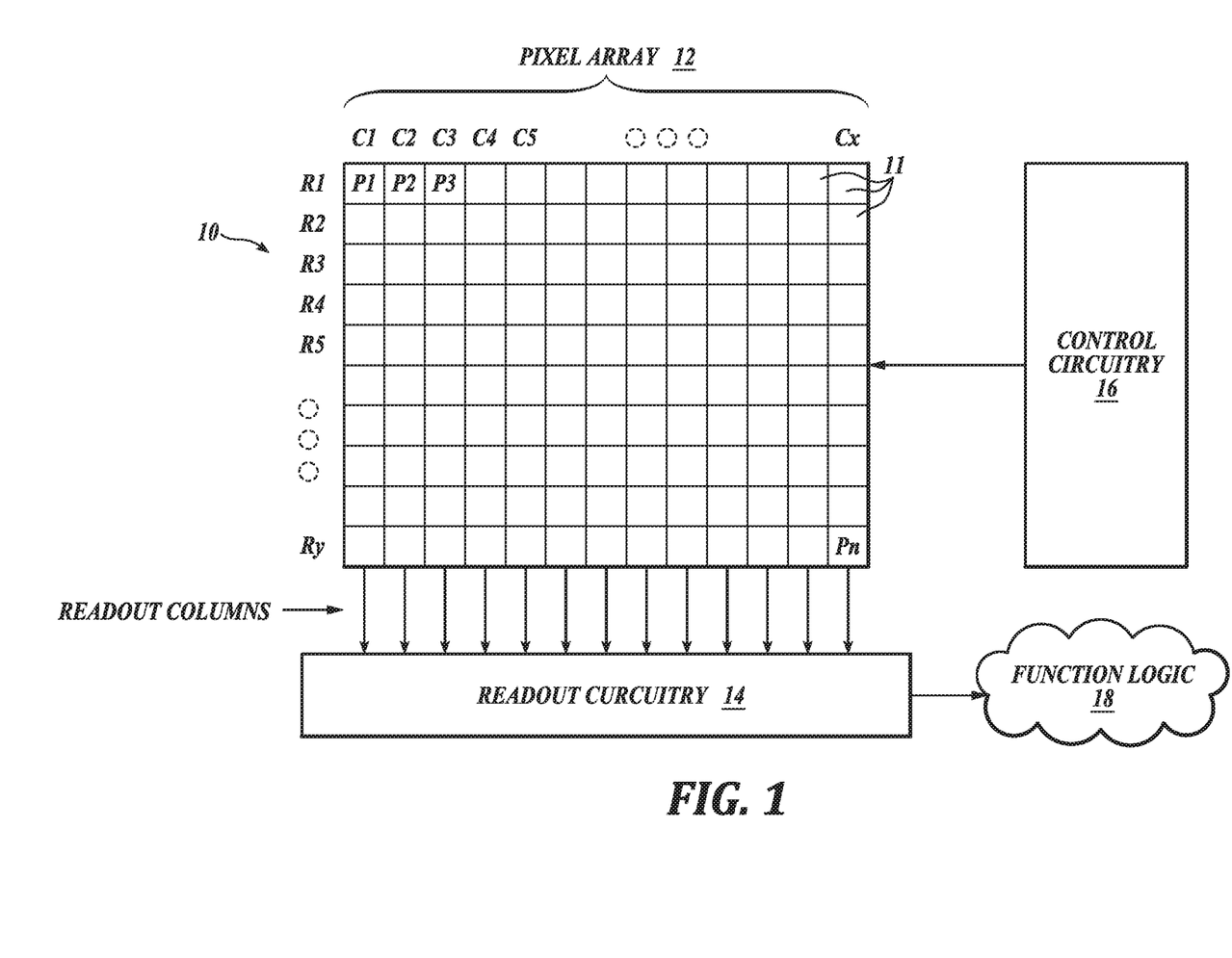
FIG. 1 is a diagram of an example image sensor in accordance with an embodiment of the present technology.

FIG. 1 is a diagram of an example image sensor 10 in accordance with an embodiment of the present technology. The image sensor 10 includes pixels 11 that are arranged in rows (R) and columns (C) of a pixel array 12. In one embodiment, pixel array 12 includes a color filter pattern, such as a Bayer pattern or mosaic of red, green, and blue additive filters (e.g., RGB, RGBG or GRGB), a color filter pattern of cyan, magenta, yellow, and key (black) subtractive filters (e.g., CMYK), a combination of both, or otherwise. When the image sensor 10 is exposed to light, the individual pixels 11 (also referred to as channels or photodiodes) acquire certain voltage values. After each pixel has acquired its voltage value, the image data is readout by a readout circuitry 14, and then transferred to a function logic 18.

Voltage values of the individual pixels ($P_1$-$P_n$) can be captured by the readout circuitry 14. For example, a control circuitry 16 may determine a specific row $R_i$ of the pixel array 12 for coupling with the readout circuitry 14. After the pixel values in row $R_i$ are captured, the control circuitry 16 may couple row $R_{i+1}$ with the readout circuitry 14, and the process repeats until voltage values of all the pixels in the column are captured. In other embodiments, the readout circuitry 14 may readout the image data using a variety of other techniques (not illustrated in FIG. 1), such as a serial readout or a full parallel readout of all pixels simultaneously. In different embodiments, the readout circuitry 14 may include amplification circuitry, analog-to-digital conversion ("ADC") circuitry, or other circuitry. In some embodiments, the pixel values are captured and processed by the function logic 18. Such processing may, for example, include image processing, image filtering, image extraction and manipulation, determination of light intensity, etc.

Figure 2:
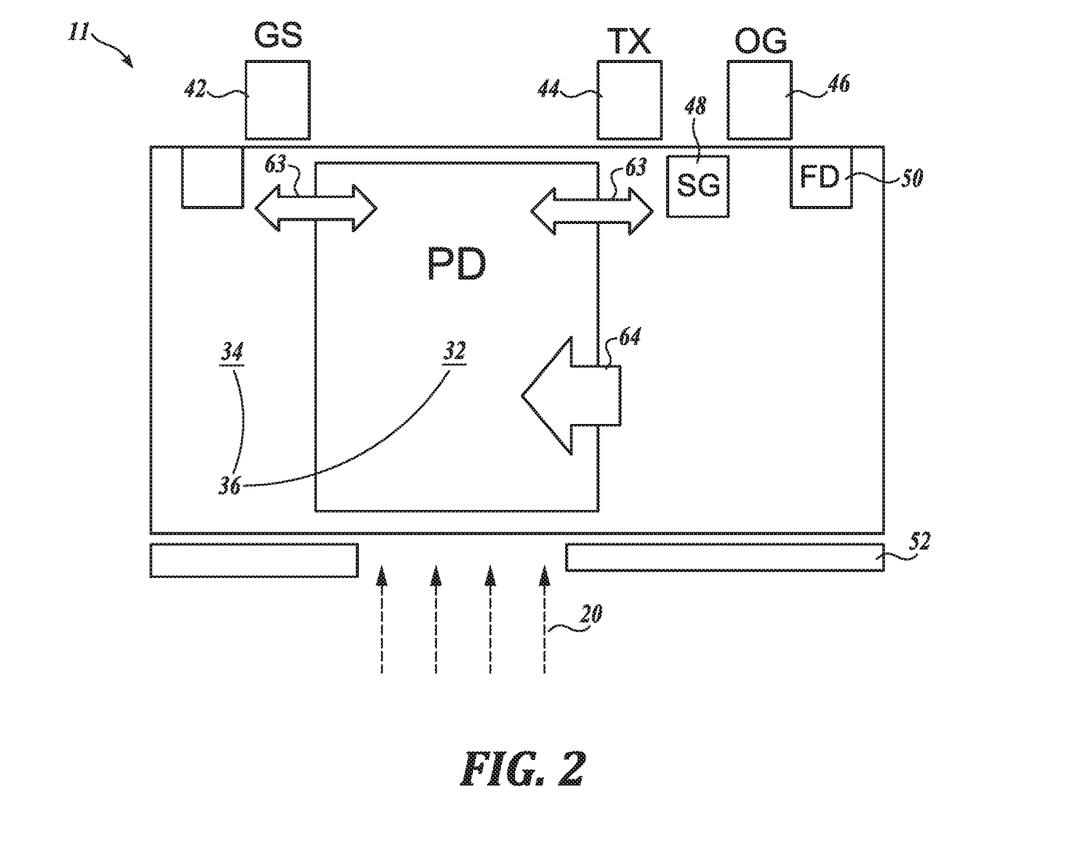
FIG. 2 is a partially-exploded view of an example photodiode in accordance with an embodiment of the present technology.

FIG. 2 is a partially-exploded view of an example pixel (photodiode) in accordance with an embodiment of the present technology. Illustrated pixel 11 may include a semiconductor substrate 36 having a P-type epitaxial region 34 and a photodiode formed in the P-type epitaxial region 34. In some embodiments, the P-type epitaxial region 34 is formed by an epitaxial growth process. The photodiode may include an N-type diffusion region 32, and the N-type diffusion region 32 may be formed by implanting dopants of N-type, such as arsenic and phosphorus, into P-type epitaxial region 34 during an ion implantation process. In some embodiments, the P-type epitaxial region 34 and the N-type diffusion region 32 may be collectively referred to as semiconductor substrate 36. In operation, the photodiode is reset to a preset voltage by a global shutter gate 42 in response to a global shutter signal GS during a global reset period. During a global exposure or integration period, incoming light 20 impinges on the N-type diffusion region 32, therefore generating free electrons that create electrical charge. This electrical charge is transferred through, for example, a planar transfer channel to a storage node (SG) 48 during global charge transfer period in response to a transfer signal TX received at the transfer gate 44. The electrical charge is further transferred to a floating diffusion region (FD) 50, for example by an output gate 46 for subsequent readout operation in response to an output signal node (OG) 46. It is known that the polarity can be reversed, for example, in some embodiments, pixel 11 may include a P-type diffusion region formed in an N-type epitaxial region for accumulating holes as electrical charges in response to incoming light 20.

In some embodiments, the exposure of the N-type diffusion region 32 to the incoming light 20 may be controlled by a light shield 52 that may be made of, for example, metal, such as tungsten or aluminum. The light shield 52 may include an opening and may function as an aperture arranged that directs the incoming light 20 to illuminate the N-type diffusion region 32. Therefore, the light shield 52 can prevent unwanted illumination of the N-type diffusion regions 32 of the neighboring pixels. In different embodiments, the light shield 52 may be made by, for example, metal deposition during manufacturing of the image sensor. However, in addition to the incoming light 20, the N-type diffusion region 32 may still be exposed to stray light 63, 64 that generates cross-optical noise among the neighboring pixels.

Figure 3:
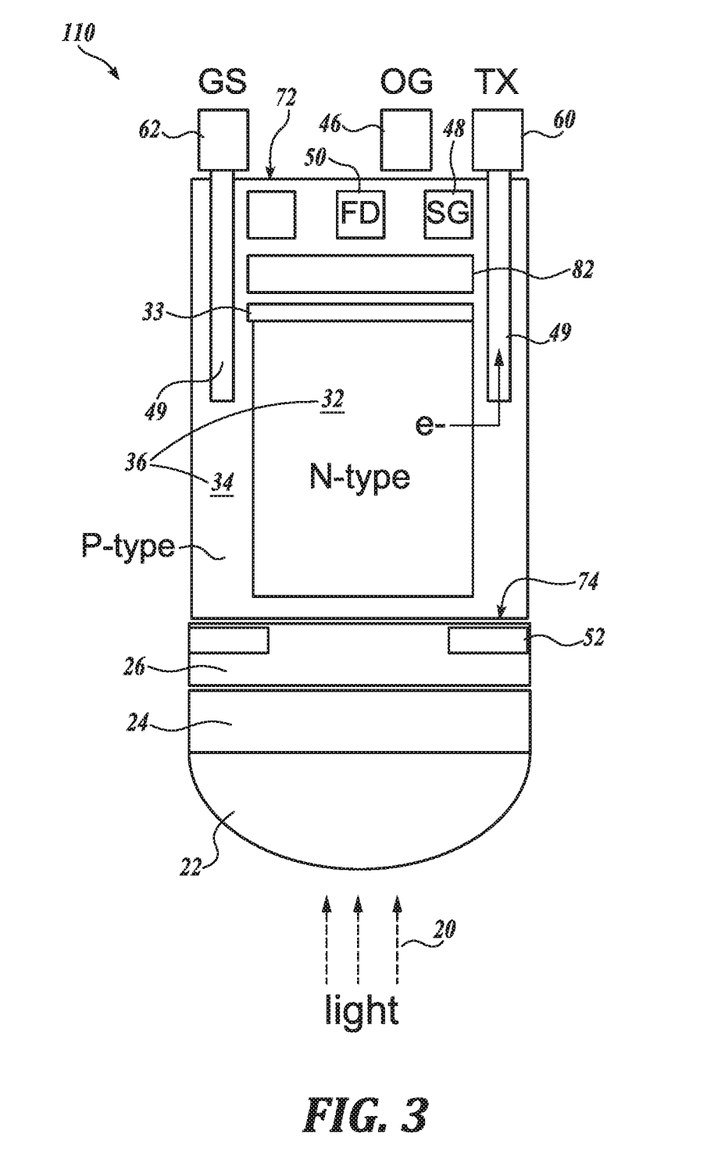
FIG. 3 is a partially-exploded view of an example photodiode having an opaque isolation element in accordance with an embodiment of the present technology.

FIG. 3 is a partially-exploded view of an example pixel 110 (also referred to as a pixel cell 110) having an opaque isolation element 82 in accordance with an embodiment of the present disclosure. An image sensor containing the example pixel 110 may be a global shutter backside illuminated image sensor. The image sensor containing a pixel array includes a plurality of example pixels 110 arranged in rows and columns. The plurality of example pixels 110 may be arranged in rows and column as illustrated by the pixel array 11 of FIG. 1. The plurality of example pixels 110 may be brought to its initial state by a global shutter gate 62 that turns on to reset the photodiodes of the pixels 110 in the pixel array to their initial values in response to a global reset signal GS.

As the resolution of the image sensor is increased and/or the size of the image sensor is decreased, the spacing between the pixels 110 is reduced, resulting in narrower and deeper photodiodes. In general, these more closely packed pixels 110 are more susceptible to noise generated by stray light. In different embodiments, stray light may be generated by reflections off the neighboring pixels or off the metallization at the front side 72.

The floating diffusion region (FD) 50 and the storage node (SG) 48 may be disposed proximate to the front side 72. The floating diffusion region (FD) 50 and the storage node (SG) 48 may lack contact and be laterally spaced apart. The floating diffusion region (FD) 50 and the storage node (SG) 48 may be coupled to output gate (OG) 46. The N-type diffusion region 32 of the photodiode in pixel 110 in FIG. 3 is implanted deeper into the semiconductor substrate 36, while the floating diffusion region 50 and the storage node (SG) 48 are disposed above the N-type diffusion region 32 to effectively utilize the pixel space, and further minimize size of the pixel 110. In addition, the pixel 110 may also include a vertical transfer gate 60, an output gate 46, and a vertical global shutter gate 62. The vertical transfer gate 60 may be a vertical transfer gate structure for transferring accumulated charges from the deeper disposed N-type diffusion region 32 to the storage node 48 in response to transfer signal TX.

The vertical transfer gate 60 of FIG. 3 is different from the planar structure of transfer gate 44 illustrated in FIG. 2. For example, the vertical transfer gate 60 includes an electrode 49 for transferring accumulated electrical charges from the N-type diffusion region 32. The electrode 49 of the vertical transfer gate 60 is formed to extend from the front side 72 of the semiconductor substrate 36 into the semiconductor substrate 36 and proximate to one side (first side) of the N-type diffusion region 32 to provide a vertical transfer channel that operatively transfers the charges accumulated in the deeper disposed N-type diffusion region 32 to the storage node 48 in response to transfer signal TX. The vertical global shutter gate 62 may also be in a form of a vertical gate structure that include an electrode 49 and the vertical global shutter gate 62 for operatively resetting the N-type diffusion region 32 using a reset value (for example, to a power supply voltage) during a global reset period in response to global reset signal GS. The electrode 49 of the vertical global shutter gate 62 may be formed to extend from the front side 72 of the semiconductor substrate 36 into the semiconductor substrate 36, and proximate to another side (second side) of the N-type diffusion region 32 to operatively reset the deep dispensed N-type diffusion region 32 to the reset value in response to global reset signal GS. The output gate 46 is configured to transfer accumulated charges from the storage node (SG) 48 to a floating diffusion region (FD) 50 in response to output signal OG.

In some embodiments, the vertical transfer gate 60 and the vertical global shutter gate 62 may be arranged to extend from the front side 72 through the semiconductor substrate 36 such that a portion of the electrode 49 of the vertical transfer gate 60 and a portion of the electrode 49 of the vertical global shutter gate 62 are overlapped with a portion of the N-type diffusion region 32 of the photodiode.

Pixel 110 may further include a microlens 22 and a color filter 24. The microlens 22 may be configured to have a first surface facing the color filter 24 and a second surface facing away from (opposite to) the first surface. The color filter 24 may be configured to have a first side facing the light shield 52 and a second side facing away from (opposite to) the first side facing a layer of buffer oxide 26. In some embodiments, the microlens 22 may operatively focus the incoming light 20 onto the N-type diffusion region 32 of the respective photodiode. The color filter 24 may operatively filter the incoming light 20 that passes through the color filter 24 from the first side of the color filter 24 to allow a selected wavelength range component of the incoming light 20 (e.g., visible light component) to pass through impinging onto the N-type diffusion region 32.

In some embodiments, the light shield 52 may be formed in the layer of buffer oxide 26. In some embodiments, the light shield 52 may be at least partially coplanar with the layer of buffer oxide 26 disposed on the backside 74 of the semiconductor substrate 36.

In operation, the incoming light 20 to an individual photodiode may pass through the microlens 22, the color filter 24, the buffer oxide 26 and the light shield 52 at a backside 74 of the semiconductor substrate 36 to impinge on the N-type diffusion region 32 of the respective photodiode during a global exposure or integration period. The resulting electrical charge (illustrated as "e-") in response to the incoming light 20, is accumulated in the N-type diffusion region 32 of the respective photodiode. The electrical charge may be collected by electrodes 49 of the vertical transfer gate 60 disposed at a front side 72 of the semiconductor substrate 36 and transferred to a storage node 48 during a global charge transfer period in response to transfer signal TX. Next, the charges are transferred from the storage node (SG) 48 toward an associated floating diffusion region (FD) 50 through output gates 44 during a readout period, for example on a row by row basis.

The N-type diffusion region 32 of the pixel 110 are electrically connected with elements at a front side 72 (e.g., global shutter (GS), vertical transfer gate (TX), etc.) through relatively deep electrodes 49. In at least some embodiments, the presence of the electrodes 49 that extend into the depth of the semiconductor substrate 36 may reduce the incidence of stray light onto the N-type diffusion region 32.

An opaque isolation layer 82 may be used to prevent incoming light 20 from penetrating through N-type diffusion region 32 and impinging onto the floating diffusion region (FD) 50 and/or the storage node (SG) 48. Otherwise, the incoming light could generate noises interfering with the read out. In some embodiments, the pixel 110 has the opaque isolation layer that includes an opaque isolation element 82 formed between the N-type diffusion region 32 on the one side, and the floating diffusion region (FD) 50 and the storage node (SG) 48 on the other side of the opaque isolation element. The opaque isolation element 82 may be formed and arranged to extend over a span of the N-type diffusion region 32 thus blocking or at least reducing impinging of incoming light 20 onto the storage node (SG) 48 and the floating diffusion region (FD) 50 through the N-type diffusion region 32. In some embodiments, the opaque isolation element 82 may be arranged to optically isolate the floating diffusion region (FD) 50 and the storage node (SG) 48 from the incoming light 20. The impingement of light onto to the storage node (SG) 48 and the floating diffusion region (FD) 50 during, for example, exposure or integration period, may generate noises that interfere with image read out. Furthermore, the opaque isolation element 82 may absorb or limit the amount of stray light that impinges on the N-type diffusion region 32, therefore limiting optical noise. In some embodiments, the opaque isolation elements 82 may extend beyond the span of the N-type diffusion region 32, or may only partially extend over the planar dimensions (X- and Y-dimensions) of the N-type diffusion region 32.

In some embodiments, the electrode 49 of the vertical transfer gate 60 and the electrode 49 of the vertical global shutter gate 62 may be laterally spaced away from the opaque isolation element 82.

In some embodiments, the N-type diffusion region 32 may be capped by a P-type implant layer 33 providing isolation between the opaque isolation element 82 and the N-type diffusion region 32. In some embodiments, the P-type implant layer 33 may be formed by implanting P-type dopants, such as boron into region between the opaque isolation element 82 and the N-type diffusion region 32.

Figure 4:
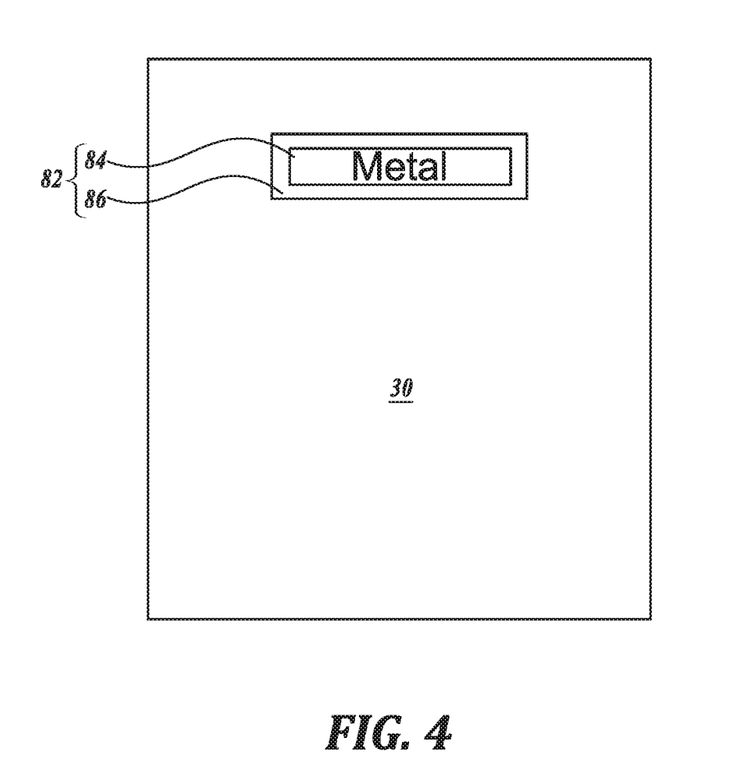
FIG. 4 shows a cross-sectional view of an opaque isolation element in accordance with an embodiment of the present technology.

FIG. 4 shows a cross-sectional view of an opaque isolation element in accordance with an embodiment of the present technology. The opaque isolation element 82 may be manufactured as a deposition layer within a semiconductor substrate 30. In some embodiments, the opaque isolation element 82 may include multiple layers of material. For example, the opaque isolation element 82 may include a metal layer 84 (e.g., copper, aluminum) that is at least partially encapsulated in a dielectric layer 86 (e.g., silicon oxide, nitrogen oxide, organic dielectric, etc.). In operation, the metal layer 84 blocks the incoming light, while the dielectric layer 86 prevents or reduces electrical leakage into the semiconductor substrate 30. In some embodiments, the dielectric layer can also be opaque. For example, the dielectric layer may be formed from opaque material with suitable thickness for the desired opacity.

Figure 5:
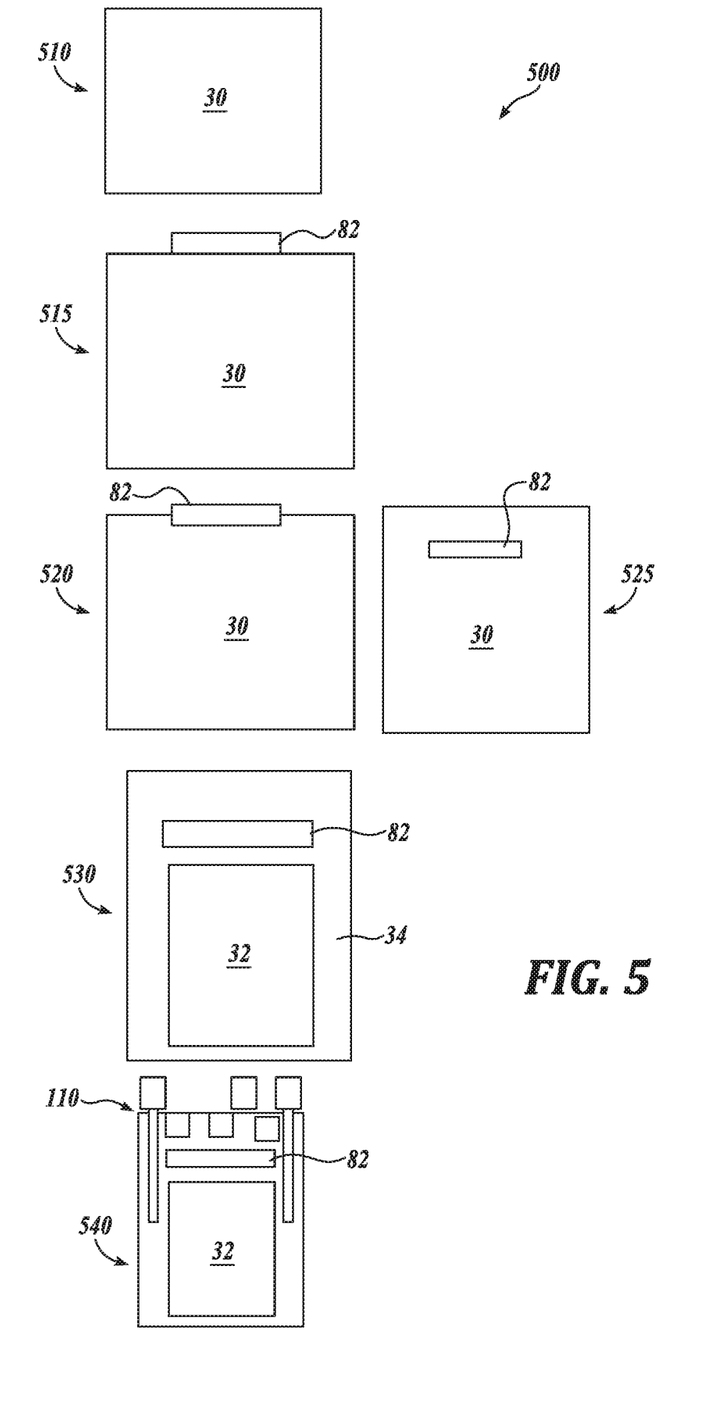
FIG. 5 is a schematic diagram of a manufacturing process in accordance with an embodiment of the present technology.

FIG. 5 is a schematic diagram of a manufacturing process 500 in accordance with an embodiment of the present technology. In some embodiments, the process may include only some of the blocks of the schematic diagram, or may include additional steps that are not illustrated in the schematic diagram 500. For simplicity, the manufacturing process 500 depicts forming a single pixel or a single pixel cell, but the process can be applied to form a plurality of pixels (pixel cells) that are arranged analogously as the pixels of the pixel array 12 of FIG. 1.

In block 510, the manufacturing process 500 starts with a semiconductor substrate 30. As one example, the material of the semiconductor substrate is silicon. However, one skilled in the art will appreciate that any group III elements (B, Al, Ga, In, Tl), group IV elements (C, Si, Ge, Sn, Pb), group V elements (N, P, As, Sb, Bi), and suitable combinations of these elements, may be used to form the semiconductor substrate.

In block 515, the opaque isolation element 82 is formed on the semiconductor substrate 30 as an opaque isolation layer. In different embodiments, forming the opaque isolation element 82 may include different manufacturing steps, for example, mask deposition, optically exposing the mask, etching, material deposition, etc. A single opaque isolation element 82 is illustrated in block 515, however the semiconductor wafer generally includes multiple opaque isolation elements 82 for different pixels (e.g., one opaque isolation element 82 per pixel). The thickness of opaque isolation element 82 may depend on the material used and the required opacity of the isolation element 82 to ensure that the incoming light 20 from backside of the semiconductor 30 substrate or stray lights does not penetrate through opaque isolation element 82 and impinge onto the diffusion regions (e.g., floating diffusion region, storage node) formed at the front side above the optical isolation element 82.

As explained above, the opaque isolation element 82 may include metal layer (material) and dielectric layer (material). In some examples, the dielectric material may include oxides/nitrides such as silicon oxide ($SiO_2$), hafnium oxide ($HfO_2$), silicon nitride ($Si_3N_4$), silicon oxynitride ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or the like. Additionally, one skilled in the relevant art will recognize that other stoichiometric combinations of the above metals/semiconductors and their oxides/nitrides/oxynitrides may be used, as long as they have a refractive index smaller than the refractive index of the semiconductor material, in accordance with the teachings of the present technology.

In blocks 520 and 525, the growth of the semiconductor substrate 30 is continued through, for example, epitaxial growth to enclose the optical isolation element 82 into the semiconductor substrate 30. In block 530, the semiconductor substrate 30 is doped by ion implantation process, thereby forming, for example, N-type diffusion region 32 under or below the optical isolation element 82. In some embodiments, it may be preferably to have a separation between the optical isolation element and N-type diffusion region 32, for example, N-type diffusion region 32 may be formed 500 Å-1000 Å deeper than the depth of the opaque isolation element 82. It may be further preferable that the lateral width of opaque isolation element 82 may be at least the same as the width of photodiode e.g., the N-type diffusion region 32 to ensure that the floating diffusion region and the storage node formed at front side above opaque. isolation element 82 from being impinged by incoming light or stray lights resulting into optical noises. In some embodiments, doping to form the N-type diffusion region 32 may be performed before opaque isolation element 82 is formed, as doping through opaque isolation element 82 may be challenging. The sequence of manufacturing steps may depend on the material selection and thickness of opaque isolation element 82. In block 540, manufacturing of the pixel 110 continues by, for example, forming doped regions including floating diffusion region and storage node formed above the opaque isolation element 82 by respective ion implantation and N-type diffusion region 32 in the semiconductor substrate 30, forming vertical transfer gates, output gates, and vertical global shutter gates, and creating metallization layers on the front side of the semiconductor substrate 30 that electrically connect the semiconductor substrates 30 with the circuitry of the image sensor formed on the front side of the semiconductor substrate 30. In some embodiments, floating diffusion region and storage node may be formed proximate to the first side of the semiconductor substrate 30 and laterally spaced apart from each other in the semiconductor substrate 30. The floating diffusion region and storage node may be doped with dopant of same conductive type as the N-type diffusion region 32. In other words, floating diffusion region and storage node may be both N-type doped regions.

Figure 6:
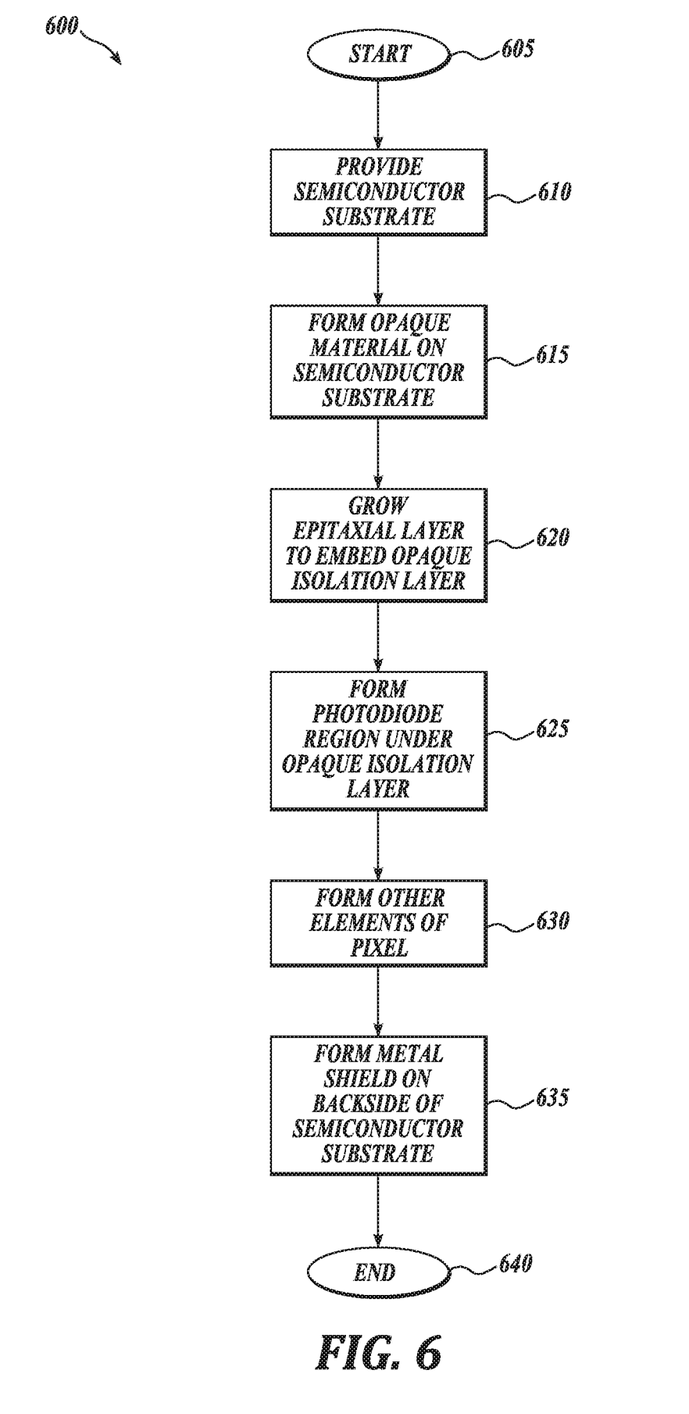
FIG. 6 is a flow diagram of a manufacturing process in accordance with an embodiment of the present technology.

FIG. 6 is a flow diagram of a manufacturing process 600 in accordance with an embodiment of the present technology. In some embodiments, the method may include only some of the steps in the flowchart, or may include additional steps that are not illustrated in the flowchart 600.

The method 600 may be used to fabricate the exemplary pixel 110 of FIG. 3, and the method 600 starts in block 605. The semiconductor substrate 30 is provided in block 610. In block 615, the opaque isolation element 82 (also referred to as the opaque isolation material or the opaque isolation elements) is formed on the semiconductor substrate 30 using, for example, the manufacturing steps discussed with reference to FIG. 5 above. In block 620, the epitaxial layer is grown over the semiconductor substrate 30, therefore embedding the opaque isolation element 82.

In block 625, the photodiode region (e.g., N-type diffusion region) of each individual pixel 110 is formed on the first side (front side) of semiconductor substrate 30 and is formed under the opaque isolation element 82. As explained above, the photodiode regions may be formed by implanting the semiconductor substrate 30 with suitable N-type dopants, e.g., arsenic (As) or phosphorus (P) and suitable implant energy. In block 630, other elements of the pixel are formed, for example, doped regions such as a floating diffusion region 50 storing accumulated charges for read out and a storage node 48 laterally space apart from floating diffusion region 50 for temporarily charge storage for global shutter operation may be formed by implanting the semiconductor substrate 30 with suitable N-type dopants and concentration, and the metallization layers that electrically connect the semiconductor materials with the circuitry of the image sensor. The opaque isolation element 82 may be arranged to shield the floating diffusion region 50 and the storage node 50 from the incoming light. In block 635, the light shield 52 is formed at the backside of the semiconductor substrate 30 to form an optical aperture. As explained above, the light shield 52 may be a metal layer that includes openings for allowing and directing the incoming light entered at the backside of the semiconductor substrate 30 to the photodiode region (e.g., N-type diffusion region).

Many embodiments of the technology described above may take the form of computer- or controller-executable instructions, including routines executed by a programmable computer or controller. Those skilled in the relevant art will appreciate that the technology can be practiced on computer/controller systems other than those shown and described above. The technology can be embodied in a special-purpose computer, application specific integrated circuit (ASIC), controller or data processor that is specifically programmed, configured or constructed to perform one or more of the computer-executable instructions described above. Of course, any logic or algorithm described herein can be implemented in software or hardware, or a combination of software and hardware.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
a plurality of photodiodes arranged in rows and columns of a pixel array disposed in a semiconductor substrate, wherein individual photodiodes of the pixel array are configured to receive an incoming light through a backside of the semiconductor substrate, wherein a front side of the semiconductor substrate is opposite from the backside, and wherein the individual photodiodes comprise a diffusion region formed in an epitaxial region;
a plurality of storage nodes (SGs), disposed on the front side of the semiconductor substrate and formed in the epitaxial region;
a plurality of global shutter gates (GS-es) disposed on the front side of the semiconductor substrate;
a plurality of transfer gates (TX), disposed proximately to the front side of the semiconductor substrate, the plurality of transfer gates configured to couple the plurality of photodiodes to the plurality of storage nodes, each of the transfer gates being configured to operatively transfer image charges generated by each coupled photodiode to each respective storage node;
an opaque isolation layer having a plurality of opaque isolation elements disposed proximate to the front side of the semiconductor substrate and proximate to the diffusion region of the plurality of photodiodes; and
a plurality of vertical electrodes connected to the transfer gates (TXs) and the global shutter gates (GS-es), the vertical electrodes being laterally spaced away from individual opaque isolation elements and extending into the epitaxial region at the front side to a depth laterally away from corresponding diffusion regions;
wherein individual opaque isolation elements are vertically stacked between corresponding diffusion regions and storage nodes (SG), and laterally configured between the vertical electrodes, and wherein the plurality of opaque isolation elements are configured to block a path of at least a portion of incoming light from the backside of the semiconductor substrate toward the plurality of storage nodes (SG).

2. The image sensor of claim 1, further comprising a plurality of light shields disposed proximate to the backside of the semiconductor substrate and proximate to the diffusion region of the plurality of photodiodes, wherein individual light shields at least partially restrict a path of the incoming light toward the diffusion region of the photodiodes.

3. The image sensor of claim 1, wherein the opaque isolation elements extend at least over the diffusion region of the corresponding photodiodes.

4. The image sensor of claim 3, wherein the individual opaque isolation elements comprise a metal layer encapsulated in a dielectric layer.

5. The image sensor of claim 4, wherein the dielectric layer is opaque.

6. The image sensor of claim 1, wherein the diffusion region is an N-type semiconductor material and the epitaxial region is a P-type semiconductor material.

7. The image sensor of claim 6, wherein each of the individual photodiodes comprises a P-type implant disposed between the diffusion region of the respective individual photodiode and the respective opaque isolation element.

8. The image sensor of claim 1, further comprising vertical gates laterally spaced away from the opaque isolation elements and extending through the epitaxial region at the front side.

9. The image sensor of claim 2, further comprising buffer oxide that is at least partially coplanar with the corresponding light shield.

10. The image sensor of claim 2, further comprising color filters having a first side facing the light shield and a second side facing away from the first side.

11. The image sensor of claim 10, further comprising microlenses having a first surface facing the color filters and a second surface facing away from the first surface.

12. A method for manufacturing a pixel cell of an image sensor, the method comprising:

providing a semiconductor substrate, wherein the semiconductor substrate has a first side and a second side opposite from the first side;

forming an opaque isolation element proximate to the first side of the semiconductor substrate;

growing an epitaxial layer proximate to the first side of the semiconductor substrate, wherein the epitaxial layer embeds the opaque isolation element; and forming a photodiode between the opaque isolation element and the second side of the semiconductor substrate.

13. The method of claim 12, further comprising:
forming a light shield proximate to the second side of the semiconductor substrate.

14. The method of claim 13, further comprising forming a buffer oxide,
wherein the light shield is at least partially coplanar with the buffer oxide.

15. The method of claim 14, further comprising:
forming a color filter on the buffer oxide; and
forming a microlens on the color filter.

16. The method of claim 12, wherein said forming the opaque isolation element comprises:
forming a metal layer of the opaque isolation element; and
forming a dielectric layer of the opaque isolation element, wherein the dielectric layer at least partially surrounds the metal layer.

17. The method of claim 16, wherein the dielectric layer is opaque.

18. The method of claim 12, wherein said forming the photodiode comprises forming a diffusion region that is an N-type semiconductor material, the method further comprising:
forming a P-type implant between the diffusion region and the opaque isolation element.

19. The method of claim 12, further comprising forming vertical gates, wherein the vertical gates are laterally spaced away from the opaque isolation elements, and wherein the vertical gates extend from the first side through the semiconductor substrate such that a portion of each vertical gate overlaps with a portion of the photodiode.

20. The method of claim 19, wherein the vertical gates comprise metal.

21. The method of claim 12, further comprising forming a floating diffusion region (FD) and a storage node (SG) proximate to the first side of the semiconductor substrate, wherein the FD and the SG are laterally spaced apart.

* * * * *